(12) United States Patent
Samani et al.

(10) Patent No.: US 12,057,518 B2
(45) Date of Patent: Aug. 6, 2024

(54) AVALANCHE PHOTODIODES WITH LOWER EXCESS NOISE AND LOWER BANDWIDTH VARIATION

(71) Applicant: Ciena Corporation, Hanover, MD (US)

(72) Inventors: Alireza Samani, Stittsville (CA); Michael Vitic, Chelsea (CA); Sean Sebastian O'Keefe, Dunrobin (CA)

(73) Assignee: Ciena Corporation, Hanover, MD (US)

( * ) Notice: Subject to any disclaimer, the term of this patent is extended or adjusted under 35 U.S.C. 154(b) by 178 days.

(21) Appl. No.: 17/592,992

(22) Filed: Feb. 4, 2022

(65) Prior Publication Data

US 2022/0336691 A1    Oct. 20, 2022

Related U.S. Application Data

(63) Continuation-in-part of application No. 17/235,070, filed on Apr. 20, 2021, now Pat. No. 11,404,596.

(51) Int. Cl.
*H01L 31/107* (2006.01)
*H01L 31/0352* (2006.01)
*H01L 31/18* (2006.01)
*H04B 10/61* (2013.01)

(52) U.S. Cl.
CPC .. *H01L 31/1075* (2013.01); *H01L 31/035254* (2013.01); *H01L 31/1812* (2013.01); *H04B 10/616* (2013.01)

(58) Field of Classification Search
CPC ............ H01L 31/1075; H01L 31/02027
See application file for complete search history.

(56) References Cited

U.S. PATENT DOCUMENTS

| | | |
|---|---|---|
| 6,188,737 B1 | 2/2001 | Bruce et al. |
| 6,980,140 B1 | 12/2005 | Rowland et al. |
| 8,126,332 B2 | 2/2012 | Bainbridge et al. |
| 8,170,074 B2 | 5/2012 | Cao et al. |
| 8,306,419 B2 | 11/2012 | Luk et al. |
| 8,306,422 B2 | 11/2012 | Bainbridge et al. |
| 10,594,281 B1 | 3/2020 | Luk et al. |
| 10,715,169 B1 | 7/2020 | Aouini et al. |
| 10,797,193 B2 | 10/2020 | Samani et al. |
| 10,811,279 B2 | 10/2020 | Pelletier et al. |
| 10,830,638 B2 | 11/2020 | Pelletier et al. |
| 10,908,474 B2 | 2/2021 | Vitic et al. |

(Continued)

FOREIGN PATENT DOCUMENTS

| | | |
|---|---|---|
| EP | 3 145 098 B1 | 3/2018 |
| EP | 3 166 238 B1 | 5/2020 |

*Primary Examiner* — Matthew L Reames
(74) *Attorney, Agent, or Firm* — Baratta Law PLLC; Lawrence A. Baratta, Jr.

(57) ABSTRACT

An avalanche photodiode includes a silicon layer on a substrate; a germanium layer on the silicon layer; a cathode and an anode on any of the silicon layer and the germanium layer; and a plurality of contacts on the germanium layer, in addition to the cathode and the anode. The silicon layer can include a highly doped region at each end, an intrinsic doped region in a middle, and an intermediately doped region between the highly doped region at each end and the intrinsic doped region, and the cathode and the anode are each at a respective a highly doped region at each end. The germanium layer can include a plurality of highly doped regions with each including one of the plurality of contacts.

18 Claims, 14 Drawing Sheets

(56) References Cited

U.S. PATENT DOCUMENTS

| | | |
|---|---|---|
| 10,911,011 B2 | 2/2021 | Luk et al. |
| 2003/0185258 A1 | 10/2003 | Dyer et al. |
| 2004/0030965 A1 | 2/2004 | Hadjihassan et al. |
| 2010/0021164 A1 | 1/2010 | Luk et al. |
| 2010/0129077 A1 | 5/2010 | Bainbridge et al. |
| 2011/0217045 A1 | 9/2011 | Watson et al. |
| 2020/0313026 A1* | 10/2020 | Szelag .............. H01L 31/02161 |
| 2020/0363665 A1 | 11/2020 | Latrasse et al. |
| 2021/0066529 A1* | 3/2021 | Lu ..................... H01L 27/14609 |
| 2022/0069153 A1* | 3/2022 | Li ..................... H01L 31/03529 |

\* cited by examiner

AVALANCHE PHOTODIODES WITH LOWER EXCESS NOISE AND LOWER BANDWIDTH VARIATION

CROSS-REFERENCE TO RELATED APPLICATION(S)

The present disclosure is a continuation-in-part of U.S. patent application Ser. No. 17/235,070, filed Apr. 20, 2021, the contents of which are incorporated by reference in their entirety.

FIELD OF THE DISCLOSURE

The present disclosure generally relates to optical devices. More particularly, the present disclosure relates to systems and methods for fabricating and controlling avalanche photodiodes with lower excess noise and lower bandwidth variation.

BACKGROUND OF THE DISCLOSURE

In Intensity Direct Detection (IDD) receivers/transceivers, work has been reported on Avalanche Photodiode (APD) receivers to enhance receiver sensitivity. Compared with PIN (Positive-Intrinsic-Negative) Photodiodes (PD), APDs can achieve 5-10 dB higher sensitivity (functional operation at lower optical power), because APDs can use their ability to multiply the photogenerated carriers to give them an effective responsivity above that of an equivalent PIN detector. Therefore, APD receivers are generally deployed on loss-limited links where the optical reach is limited by thermal noise rather than by optical noise (e.g., Amplified Spontaneous Emission (ASE) noise of optical amplifiers). All presently known balanced photodetection receivers use a pair of PIN photodetectors. Initially, receivers were implemented using free-space optics. Advancements in Silicon Photonics (SiP) technology have led to the ability to integrate a full receiver O-E front-end onto a silicon substrate. The current generation of SiP balanced receivers is PIN PD based, but the technology has the potential to integrate APD devices into IDD and balanced receivers.

The received signal voltage ($V_{Signal}$) of a balanced photodetection receiver channel is given by $V_{Signal} \propto GAIN_{ELEC} \cdot \sqrt{R_{SIG} \cdot P_{SIG} \cdot R_{LO} \cdot P_{LO}}$, where $GAIN_{ELEC}$ is the electrical gain of the receive path, $R_{SIG}$ and $R_{LO}$ are the responsivities of the PD to the signal light (from the line system) and the local oscillator (LO) respectively, and the $P_{SIG}$ and $P_{LO}$ are the optical powers of the signal light and the local oscillator. If a receiver is required to generate a higher $V_{Signal}$ at a fixed $P_{SIG}$ due to limitations of the line system, one or more of the other terms must be increased.

Increasing the electrical gain of the receive path can be achieved by adding more gain in the TIA (Transimpedance Amplifier) design, by adding additional gain stages between the TIA and Analog to Digital Converter (ADC), or by "effectively" increasing the gain of those blocks by reducing the swing required to achieve a full-scale amplitude (fill) on the ADC. Each of the options has disadvantages or challenges. The amount of gain in the TIA may be limited by the capabilities of the transistors in the amplifier. Higher gain and more stages in the design tend to dissipate more power, increase design complexity, increase the tendency for oscillations and resonances, and generally add more noise to the design. Lowering the ADC full-scale amplitude is limited by ADC thermal and quantization noise.

Increasing the LO power can be achieved by increasing the laser diode (Integrable Tunable Laser Assembly (ITLA)) power, by having two lasers in a modem—one for the transmitter and one for the receiver, or by directing more optical power from the ITLA to the receiver. Each of these also has disadvantages. Increasing the laser diode power increases power consumption in the diode itself, which increase the load on the Thermoelectric Cooler (TEC) which will then need to dissipate more power to maintain the laser diode at a fixed/optimum temperature. Additionally, there is a limit to the maximum operating point of the laser diode before it begins to contribute excessive optical noise to the signal. These higher operating points also affect the reliability of the device, so there is a practical upper limit to the available power. Having two lasers increases cost, the physical volume of the product, and increases the power consumption of the system by the addition of the second ITLA and its associated control circuitry. In the case where more light is diverted to the receiver, the resulting reduction in the amount of power sent to the transmitter is likely to cause increased power dissipation requirements and design challenges in the transmitter subsystem to achieve its required specifications.

The other variable to adjust is the responsivities of the PDs. There is always a tradeoff of bandwidth, size, power-handling, and fabrication constraints, and there tends to be a "best" PIN detector in a given fabrication technology for a given application. PIN detectors have a fixed responsivity, and thus this is not a "variable" in the design. The best design is used, and the value is fixed. In the case of an APD, the voltage across the device can be used to achieve a multiplication effect of the photogenerated carriers, thus being able to achieve a higher effective responsivity (amps/watt-of-light) by generating more current for a given amount of light. This additional gain can be used to achieve a higher Vsignal or it can be used to relax the requirements on some of the other variables in the above equation. This gain doesn't come for free, and there will be additional noise generated as well. This patent describes a novel way to use the multiplication effect of an APD formed in a SiP process, while optimizing (minimizing) the additional noise generated in the device.

Also, there is a need for gain control and low noise operation in avalanche photodiodes. Two example instances of gain control are described in U.S. Pat. No. 10,797,193, the contents of which are incorporated by reference, and Xiaoge Zeng, Zhihong Huang, Binhao Wang, Di Liang, Marco Fiorentino, and Raymond G. Beausoleil, "Silicon—germanium avalanche photodiodes with direct control of electric field in charge multiplication region," Optica 6, 772-777 (2019), the contents of which are incorporated by reference.

The structure detailed in U.S. Pat. No. 10,797,193 is a separate absorption, charge, and multiplication (SACM) APD with gain control. The structure details a third contact which allows further control of electric field in the absorption and multiplication regions of an APD. A V3 contact on the Si at the back of the PD is connected to the P doped silicon and is used as a gain control knob. The i-Si regions are used as multiplication regions, and the P-Silicon is a charge region. V1 and V2 are static voltages used to reverse bias the APD below breakdown voltage. This has 3 main shortcomings: a) the APD can only be single entry due to the presence of V3 contact at the back of the APD, which can result in lower responsivity if light were to pass through this piece of waveguide, and b) higher reverse bias voltage due to the large distance between the N-doped Si and P-doped Ge.

In the paper by Xiaoge Zeng et al., the APD also incorporates a gain control contact on Ge. In this paper the Ge is only doped using P-dopants. The APD has 3 contacts and uses a single contact to control the gain. There is a need to create a more uniform and symmetric E-field in the Ge, to which a solution is described herein.

BRIEF SUMMARY OF THE DISCLOSURE

Again, the present disclosure relates to systems and methods for avalanche photodiodes with lower excess noise and lower bandwidth variation. Conventional germanium-on-silicon avalanche photodetectors (APD) lack independent control over gain and bandwidth because of dependency on reverse bias voltage. In addition, these APDs suffer from high excess noise due to multiplication of carriers happening in germanium. In the following embodiments, the present disclosure addresses both issues by implementing a novel lateral heterojunction Ge-on-Si APD design with four contacts, which enables the tuning of the gain of the APD by controlling the electric field in the germanium and silicon through two gain control contacts. This added gain tuning control can be used to tailor the electric field profile such that multiplication happens mostly in silicon to achieve lower excess noise and little to no bandwidth variation. This excess noise is the factor by which the APD noise power increases compared with that of an ideal photodetector. Thus, keeping the additional noise low while increasing the multiplication gain of the APD achieves the desired result.

In another embodiment, the present disclosure describes a novel vertical heterojunction Ge-on-Si avalanche photodetector (APD) design which enables the tuning of the gain of the APD by controlling the electric field in the germanium and silicon through a third contact. It addresses two critical issues observed with conventional vertical junction Ge-on-Si APDs. First, the lack of independent control over gain and bandwidth because of dependency on a single reverse bias voltage. Secondly, conventional APDs suffer from high excess noise due to multiplication of carriers happening in germanium. The heterojunction's added gain tuning control voltage can be used to increase the electric field in just the silicon so that the multiplication happens mostly there, instead of in the germanium, to achieve lower excess noise. This excess noise is the factor by which the APD noise power increases compared with that of an ideal photodetector and keeping the additional noise low while increasing the multiplication gain of the APD is the desired result and with little to no bandwidth change.

Also, the present disclosure relates to systems and methods for balancing a pair of Avalanche Photodiodes (APD) in a coherent receiver. Specifically, the present disclosure includes an approach to set and control the bias voltages of a pair of APD of a balanced photodetection receiver for optimum receiver Common-Mode Rejection Ratio (CMRR) (DC and AC) and optimum receiver Signal-to-Noise Ratio (SNR).

In an embodiment, a coherent receiver having a pair of Avalanche Photodiodes (APD) also includes circuitry configured to obtain an output ($P_{IN,CM}$) that indicates the electrical power of an AC common-mode input signal, associated with the pair of APDs. A control processor adjusts one or more of the reverse bias voltages (VAPD) on a P-path ($VAPD_P$) or on an N-path ($VAPD_N$) of the pair of APDs, adjusting the voltages to minimize the AC common mode indicator ($P_{IN,CM}$). The p-path and n-path are complements of each other (Differential Signaling; transmitting information using two complementary signals). A common-mode optical noise rejection specification (or target) on a signal port can be set based on a lowest value possible for the output ($P_{IN,CM}$).

The circuitry can be further configured to adjust a Transimpedance Amplifier (TIA) common-mode AC response, $Adj_{CM\_AC\_Response}$, responsive to an output ($P_{OUT,CM}$) that indicates electrical power of an AC common-mode output signal. The common-mode AC response, $Adj_{CM\_AC\_Response}$, can be used to dynamically adjust a P-path and an N-path transfer function difference, based on a lowest value possible for the output ($P_{OUT,CM}$).

The circuitry can be further configured to adjust one or more of $VAPD_P$ and $VAPD_N$ responsive to received signal Signal-to-Noise Ratio (SNR). The one or more of $VAPD_P$ and $VAPD_N$ can be set based on a highest value possible for the SNR. Values of $VAPD_P$ and $VAPD_N$ can be used to adjust multiplication factors ($M_P$) and ($M_N$), respectively. The output ($P_{IN,CM}$) and the output ($P_{OUT,CM}$) can be from the TIA.

The circuitry can be further configured to adjust one or more of $VAPD_P$ and $VAPD_N$ responsive to received signal Signal-to-Noise Ratio (SNR). Values of $VAPD_P$ and $VAPD_N$ can be used to adjust multiplication factors ($M_P$) and ($M_N$), respectively. The output ($P_{IN,CM}$) and the output ($P_{OUT,CM}$) can be from the TIA.

In a further embodiment, a method, implemented in a coherent receiver having a pair of Avalanche Photodiodes (APD), includes adjusting one or more of a reverse bias voltage (VAPD) on a P-path ($VAPD_P$) and on an N-path ($VAPD_N$) responsive to an output ($P_{IN,CM}$) that indicates electrical power of an AC common-mode input signal; and adjusting a Transimpedance Amplifier (TIA) common-mode AC response, $Adj_{CM\_AC\_Response}$, responsive to an output ($P_{OUT,CM}$) that indicates electrical power of an AC common-mode output signal.

The method can further include adjusting one or more of $VAPD_P$ and $VAPD_N$ based on a received signal Signal-to-Noise Ratio (SNR). A common-mode optical noise rejection on a signal port can be set based on a lowest value possible for the output ($P_{IN,CM}$). The common-mode AC response, $Adj_{CM\_AC\_Response}$, can be used to dynamically adjust a P-path and an N-path transfer function difference, based on a lowest value possible for the output ($P_{OUT,CM}$).

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Also, the present disclosure relates to systems and methods for balancing a pair of Avalanche Photodiodes (APD) in a coherent receiver. With avalanche photodetectors, the O-E (Optical to Electrical) conversion (M multiplication factor) can be greater than 1. The received signal becomes $I_{signal} \propto M \cdot \sqrt{P_{SIG} \cdot P_{LO}}$. APD photodetectors do require higher bias voltages than PIN photodetectors. APD bias chips are commercially available, and they are low-power and small devices targeted for pluggable transceivers solutions. Therefore, an APD balanced receiver (a pair of APD photodetectors) can enhance its sensitivity with a minimal power dissipation penalty. From another perspective, APD balanced receivers can achieve the same sensitivity as PIN balanced receivers with lower LO power, thus allowing more laser power to the transmitter to improve its output optical power.

§ 1.0 SET AND CONTROL THE REVERSE BIAS VOLTAGES OF A PAIR OF APD FOR BALANCED PHOTODETECTION

To achieve optimum balanced photodetection, the setting of the bias voltages (or M) of a pair of APD must be controlled for optimum CMRR (DC and AC) and SNR performance. In this disclosure:

1) The receiver (Rx) TIA has the capability to meter the common-mode input power at the TIA input stage for the Rx Control Processor to set APD reverse bias voltage VAPD for optimum optical CMRR.
2) The receiver (TIA) has the capability to meter the common-mode output power at the TIA output stage for the Rx Control Processor to set the receiver common-mode response for optimum electrical/radio-frequency (RF) CMRR.
3) The receiver (Digital Signal Processor (DSP)) also has the capability to meter the received signal SNR for the Rx Control Processor to set VAPD for optimum receiver SNR.

Figure 1:
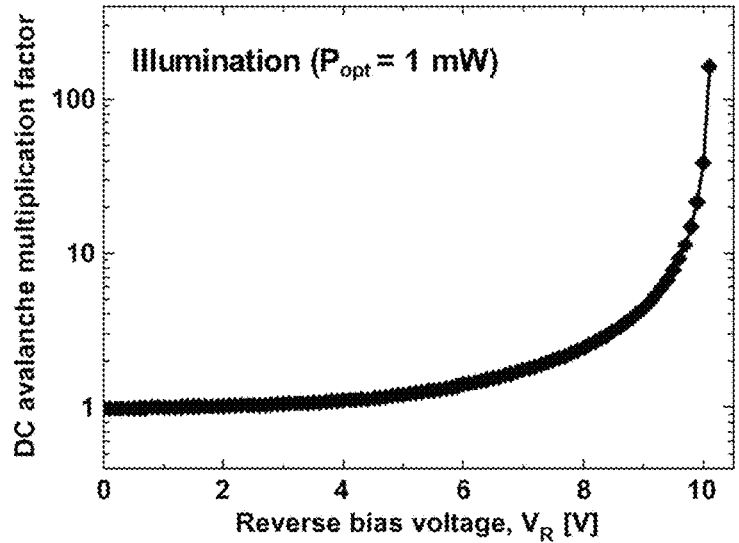
FIG. 1 is a graph of a sample multiplication factor (M) of an APD is determined by the APD reverse bias voltage (VAPD).

Thus, the present disclosure includes a process to set and control the reverse bias voltages of a pair of APD for balanced photodetection. The optical-to-electrical (O-E) conversion known as the multiplication factor (M) of an APD is determined by the APD reverse bias voltage (VAPD). A sample of M vs. VAPD is shown in FIG. 1.

Performance metrics of an APD are:
1) O-E conversion efficiency—the higher the APD bias voltage, the higher the O-E conversion becomes.
2) APD bandwidth—its bandwidth varies against APD bias voltage.
3) Excess noise factor—this is the factor by which the APD noise power increases compared with that of an ideal photodetector.

Figure 2:
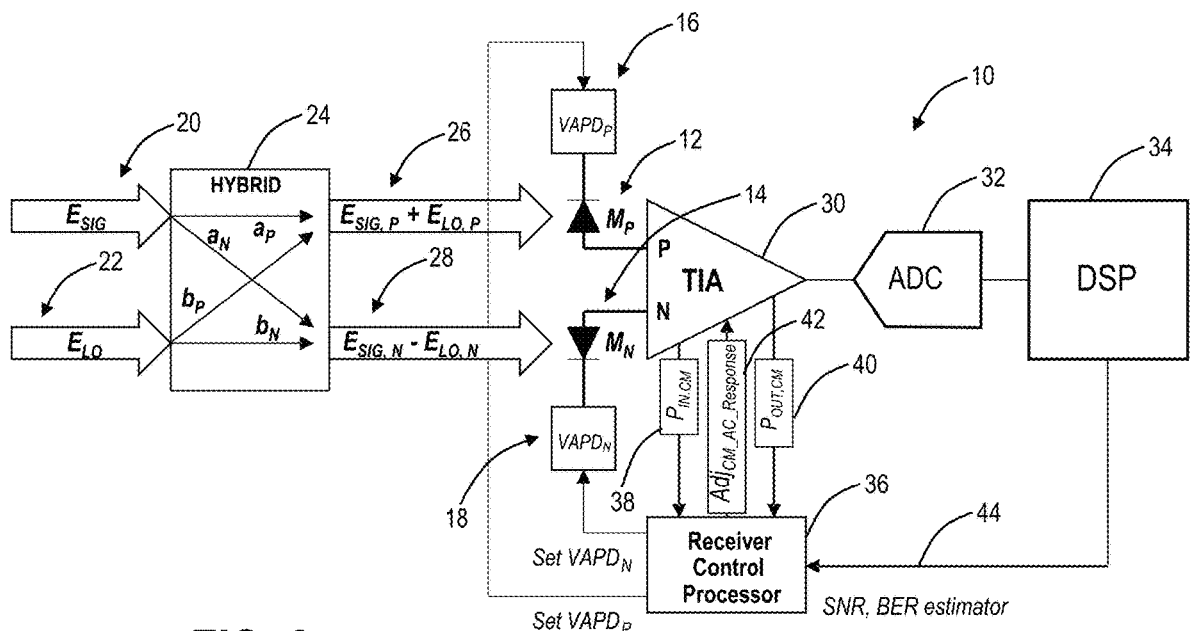
FIG. 2 is a block diagram of a system for balancing a pair of Avalanche Photodiodes (APD) photodetectors in a coherent receiver.

FIG. 2 is a block diagram of a system 10 for balancing a pair of Avalanche Photodiodes (APD) 12, 14 photodetectors in a coherent receiver. The setting of the bias voltage (VAPD) 16, 18 to each APD is based on the following factors:
1) Matching O-E conversion between the APD 12, 14 pair to achieve optimal optical CMRR performance. This includes the optical path losses on a Signal (SIG) path 20 (which is more important) and a LO path 22. There is an optical hybrid 24 for E-field mixing.
2) Minimizing the difference in APD receiver RF response between a P-path 26 and an N-path 28 can be achieved by adjusting the VAPD 16, 18 setting of each APD 12, 14. The multiplication factor (M) of each APD 12, 14 can be different at the system-optimum setting due to a difference in optical path loss from SIG and LO port to each APD 12, 14, or various other normal efficiency distributions.
3) Optimizing the APD 12, 14 multiplication factor (M) and excess noise factor F(M) for optimal SNR.

Each of these three factors is discussed in greater detail below; the first two are particularly important for coherent receivers, especially when operating in colorless networks. Also, of note, FIG. 2 is a high-level functional diagram and does not capture the detailed circuit implementation—e.g., solutions to bias the APD 12, 14, the APD-to-TIA 30 connection, TIA design, etc. The TIA 30 connects to an Analog-to-Digital Converter (ADC) 32, which connects to a Digital Signal Processor (DSP) 34 that provides feedback to a control processor 36.

§ 1.1 Setting M of APD_P and APD_N for Optimum CMRR $\alpha_P$ and $\alpha_N$ are optical SIG path 20 loss to APD_P and APD_N, respectively.

$\beta_P$ and $\beta_N$ are optical LO path 22 loss to APD_P and APD_N, respectively.

Optical CMRR for SIG path 20 and LO path 22 can be described as:

$$CMRR_{SIG} = \frac{|\alpha_P M_P - \alpha_N M_N|}{\alpha_P M_P + \alpha_N M_N} \text{ and}$$

$$CMRR_{LO} = \frac{|\beta_P M_P - \beta_N M_N|}{\beta_P M_P + \beta_N M_N}.$$

By inspection of the above equations, there is a combination of $M_P$ and $M_N$, e.g., $\alpha_P M_P \approx \alpha_N M_N$ for $CMRR_{SIG}$ and $\beta_P M_P \approx \beta_N M_N$ for $CMRR_{LO}$, which provides the best (lowest) common-mode optical noise rejection on the SIG port and LO port, respectively. In a colorless network, the receiver common-mode optical noise dominantly comes from the SIG port. Therefore, $CMRR_{SIG}$ is the more important parameter.

To optimize the $CMRR_{SIG,LO}$ parameter, the TIA 30 will provide an output ($P_{IN,CM}$) 38 that indicates the electrical power of the AC common-mode input signal. The receiver control processor 36 will dynamically adjust $M_P$ ($VAPD_P$) and $M_N$ ($VAPD_N$) to achieve the lowest common-mode input power $P_{IN,CM}$ possible.

§ 1.2 Balancing the Receiver Differential Transfer Function

Figure 3:
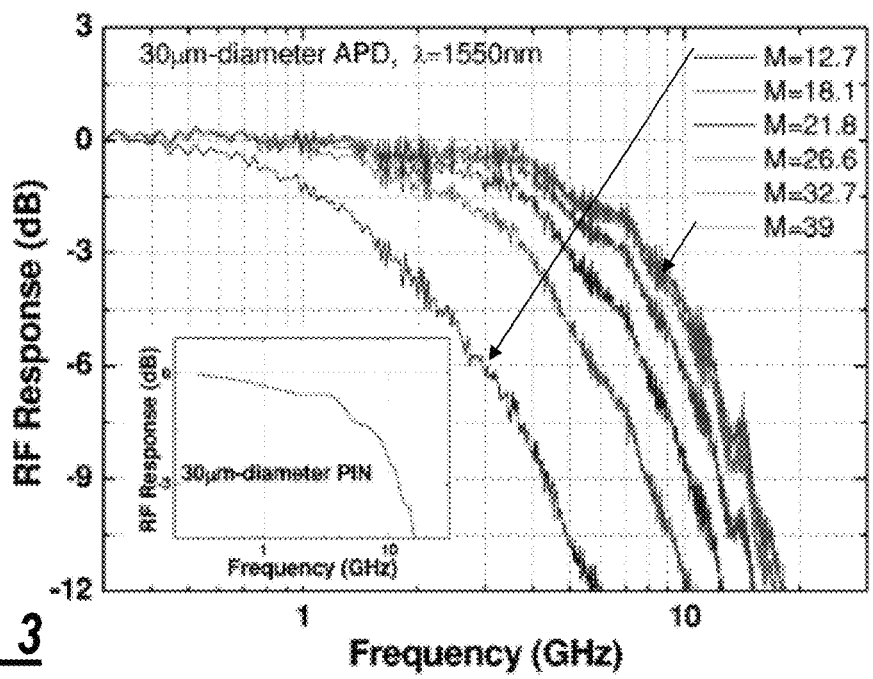
FIGS. 3 and 4 are graphs of examples of the frequency response of an APD varying as a function of M (VAPD).
Figure 4:
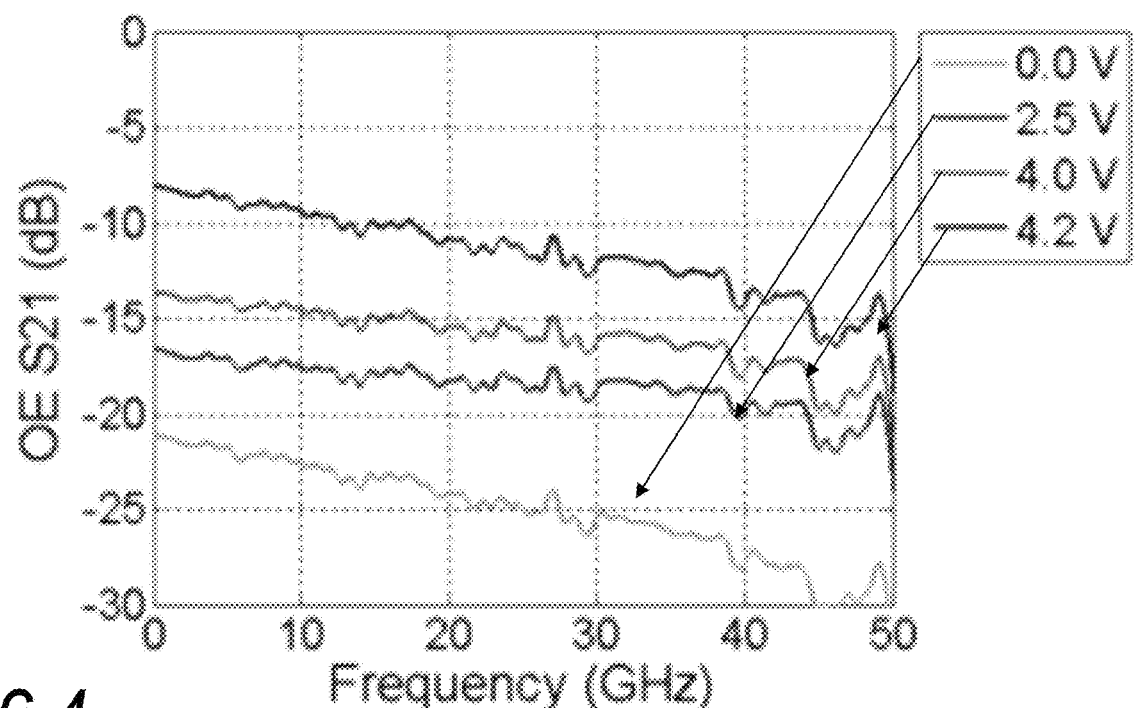

The frequency response of an APD varies as a function of M (VAPD). Examples are shown in FIGS. 3 and 4. When the M values of a pair of APD 12, 14 for balanced photodetection are set differently on the P-side and N-side for optimum optical CMRR performance as described in (1), the APD's frequency response on the P-side and N-side can be different.

Commonly-assigned U.S. Pat. No. 10,209,127, the contents of which are incorporated by reference in their entirety, describes a technique to set a difference in the receiver's AC transfer function of P-path 26 and N-path 28 to improve its AC CMRR performance. With this feature in the receiver, the receiver can further reduce the receiver's RF common-mode gain.

To optimize the $CMRR_{RF}$ parameter, the TIA will provide an output ($P_{OUT,CM}$) 40 that indicates the electrical power of the AC common-mode output signal. The receiver control processor 36 will dynamically adjust the receiver's P-path 26 and N-path 28 transfer function difference by adjusting the TIA's common-mode AC response 42, $Adj_{CM\_AC\_Response}$, to achieve the lowest common-mode output power $P_{OUT,CM}$ possible.

§ 1.3 Setting M of APD P and APD N for Optimum SNR

This topic has been widely discussed in optical communication textbooks. The SNR of a balanced photodetection receiver with a pair of APD can be expressed as:

$$SNR \approx \frac{8 \cdot P_{SIG} P_{LO} \cdot M^2}{2q_e P_{LO} B \cdot M^2 F(M) + 2q_e P_{SIG} B \cdot M^2 F(M) + IRN_{Ave} B}$$

M is the multiplication factor; F(M) is the excess noise factor $$F(M) = kM + (2-M)\frac{1}{k} \approx M^x.$$

The first two noise terms in the denominators are LO shot noise, and SIG shot noise, respectively. The last noise term is the thermal noise of the receiver. Since SNR is a function of M and F(M), there exists an optimum M setting as a function of $P_{SIG}$.

$$M_{Optimum}^{2+x} \approx \frac{IRN}{x \cdot q_e \cdot (P_{SIG} + P_{LO})}$$

To optimize the SNR parameter the DSP 34 will provide an output 44 which indicates the SNR of the received signal. The receiver control processor 36 will dynamically adjust $M_P$ ($VAPD_P$) and $M_N$ ($VAPD_N$) to achieves the highest SNR possible. Alternatively, the receiver control processor 36 can estimate the optimum M value based on the equation above and set $VAPD_P$ and $VAPD_N$ using a M vs. VAPD look-up table.

§ 1.4 Control Process of an APD Balanced Receiver

Figure 5:
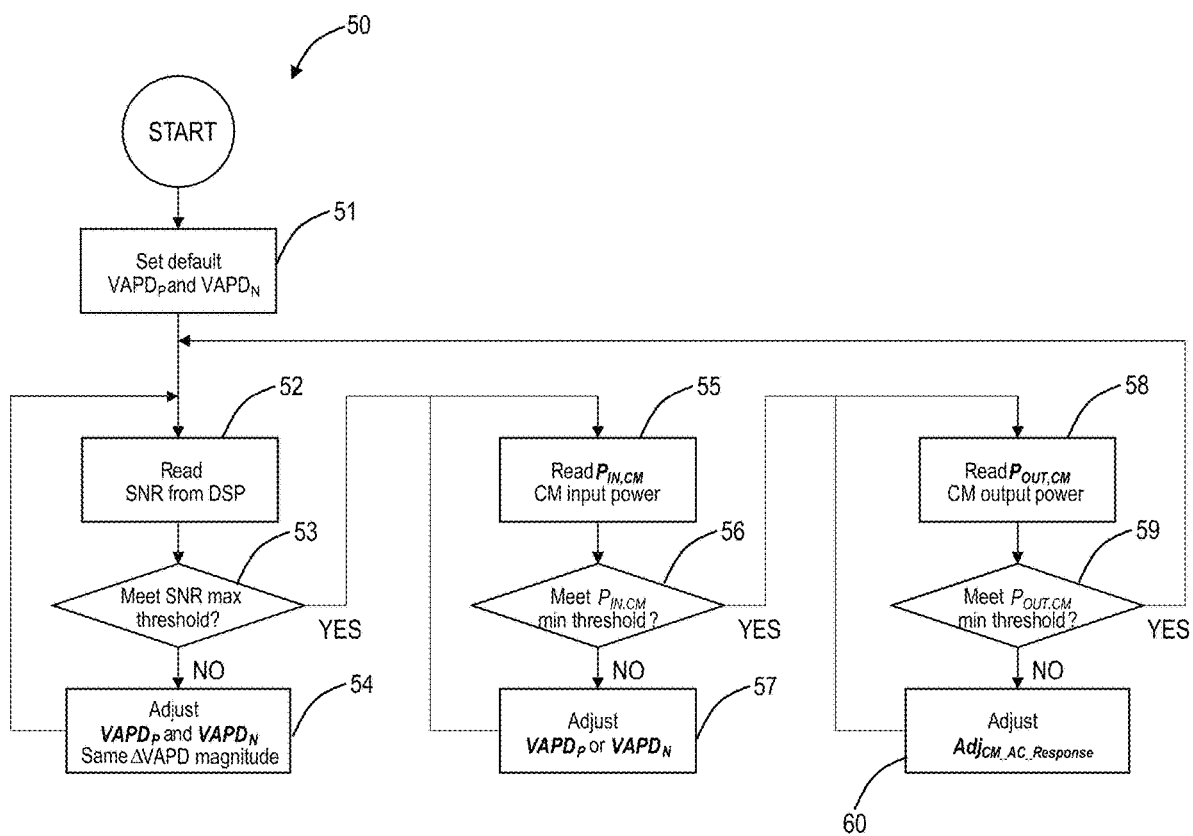
FIG. 5 is a flowchart of a control process of an APD balanced receiver.

FIG. 5 is a flowchart of a control process 50 of an APD balanced receiver. The control process 50 can be implemented by the system 10. The control process 50 includes setting a default $VAPD_P$ and $VAPD_N$ (step 51) and the SNR is read from the DSP 34 (step 52). The control process 50 includes checking if the SNR meets a maximum SNR threshold (step 53), and, if not, the $VAPD_P$ and $VAPD_N$ are adjusted, with the same $\Delta VAPD$ magnitude (step 54), and the control process 50 returns to step 52.

If the SNR meets the maximum SNR threshold (step 53), the control process 50 includes reading the output ($P_{IN,CM}$) 38, which indicates the electrical power of the AC common-mode input signal (step 55). The control process 50 includes checking if the output ($P_{IN,CM}$) 38 meets a minimum threshold (step 56), and, if not, the $VAPD_P$ or $VAPD_N$ are adjusted (step 57), and the control process 50 returns to step 55.

If the output ($P_{IN,CM}$) 38 meets a minimum threshold (step 56), the control process 50 includes reading the output ($P_{OUT,CM}$) 40 0, which indicates the electrical power of the AC common-mode output signal (step 58). The control process 50 includes checking if the output ($P_{OUT,CM}$) 40 meets a minimum threshold (step 59), and, if not, the control process 50 includes adjusting the TIA's common-mode AC response 42, $Adj_{CM\_AC\_Response}$, to achieve the lowest common-mode output power $P_{OUT,CM}$ possible (step 60), and the control process 50 returns to step 58.

If the output ($P_{OUT,CM}$) 40 meets a minimum threshold (step 59), the control process 50 returns to step 52, e.g., can continually run.

Figure 6A:
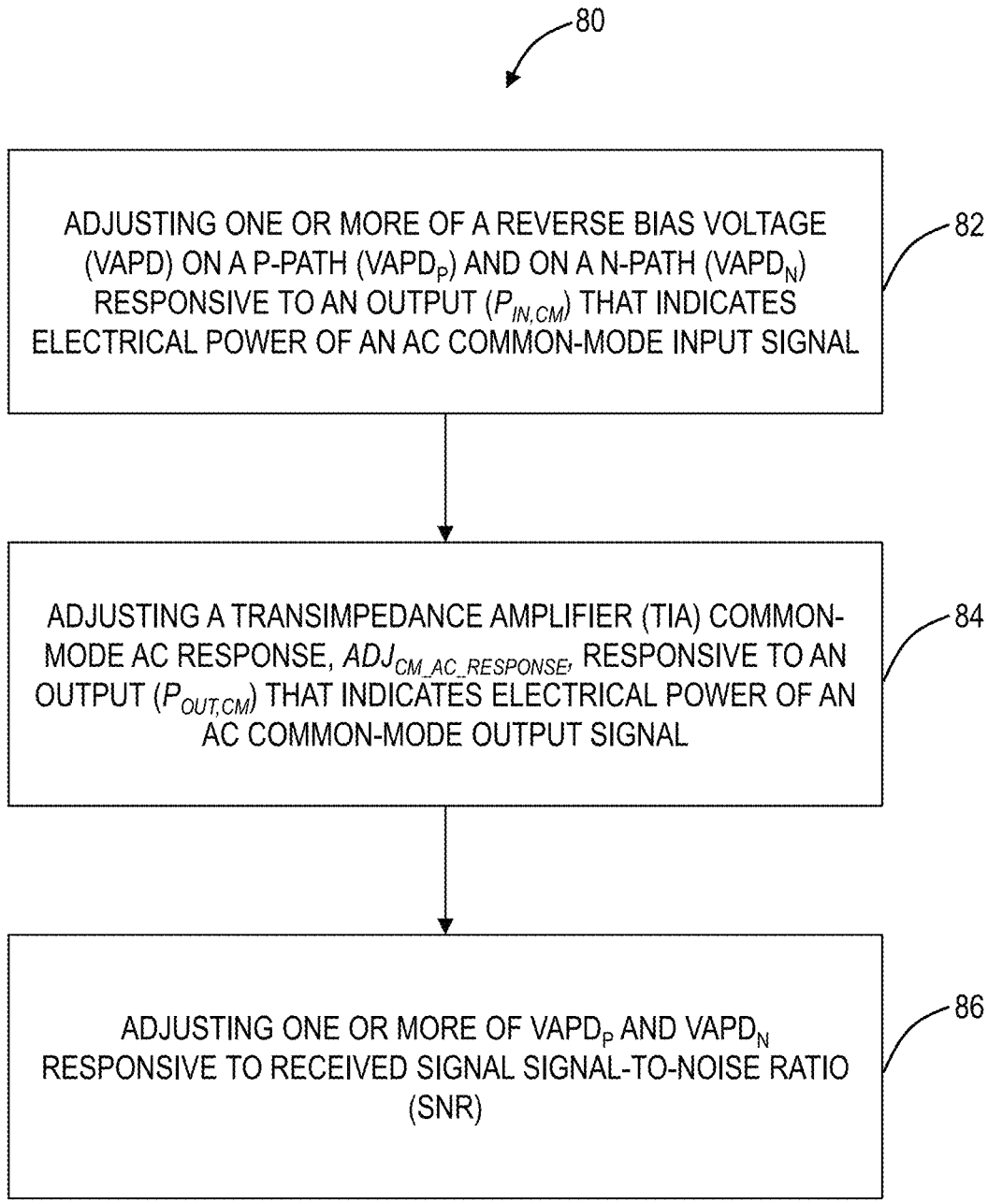
FIG. 6A is a flowchart of a process implemented to balance a pair of Avalanche Photodiodes (APD) photodetectors in a coherent receiver.

FIG. 6A is a flowchart of a process 80 implemented to balance a pair of Avalanche Photodiodes (APD) photodetectors in a coherent receiver. In an embodiment, the process 80 is implemented by the control processor 36, as a method, and as instructions stored on a non-transitory computer-readable medium.

The process 80 includes adjusting one or more of a reverse bias voltage (VAPD) on a P-path ($VAPD_P$) and on an N-path ($VAPD_N$) responsive to an output ($P_{IN,CM}$) that indicates the electrical power of an AC common-mode input signal (step 82); adjusting a Transimpedance Amplifier (TIA) common-mode AC response, $Adj_{CM\_AC\_Response}$, responsive to an output ($P_{OUT,CM}$) that indicates electrical power of an AC common-mode output signal (step 84); and adjusting one or more of $VAPD_P$ and $VAPD_N$ responsive to received signal Signal-to-Noise Ratio (SNR) (step 86).

A common-mode optical noise rejection on a signal port can be set based on the lowest value possible for the output ($P_{IN,CM}$). The coherent receive can operate in a colorless configure where the common-mode optical noise rejection on the signal port dominates over the common-mode optical noise rejection on a Local Oscillator (LO) port.

The common-mode AC response, $Adj_{CM\_AC\_Response}$, can be used to dynamically adjust a P-path and an N-path transfer function difference, based on the lowest value possible for the output ($P_{OUT,CM}$).

The one or more of $VAPD_P$ and $VAPD_N$ can be set based on the highest value possible for the SNR. The SNR is one of from a Digital Signal Processor (DSP) and estimated based on a look-up table.

Values of $VAPD_P$ and $VAPD_N$ are used to adjust multiplication factors ($M_P$) and ($M_N$), respectively. The output ($P_{IN,CM}$) and the output ($P_{OUT,CM}$) can be from the TIA.

The APD can be a lateral heterojunction Ge-on-Si APD design with four contacts for tuning of gain of the APD by controlling an electric field in the germanium and silicon through two gain control contacts.

The APD can be a vertical heterojunction Ge-on-Si APD design with gain-tuning contacts that enable control of an electric field separately in Si and Ge layers. APD balanced receivers can achieve the same sensitivity as PIN balanced receivers with lower LO power, thus allowing more laser power to the transmitter to improve its output optical power. The approach described herein enables target higher optical Tx powers in small form factor pluggable modules (e.g., QSFP-DD without EDFAs) or a higher Tx Optical SNR (OSNR) by being able to trade more LO power to the Tx from the Rx without sacrificing Rx performance. This approach also improves interfering channel rejection in a colorless approach by optimizing the APD balanced receiver's CMRR. Without the CMRR optimization, an APD balanced receiver's CMRR can be very poor—process variation between a PIN-PD pair is already challenged to meet a typical CMRR spec of 20 dB because adding a difference in multiplication factor between an APD-PD pair with the same VAPD will lead to even poorer CMRR. APD's multiplication factor further increases the difference in the APD's intrinsic responsivity at M=1.

Figure 6B:
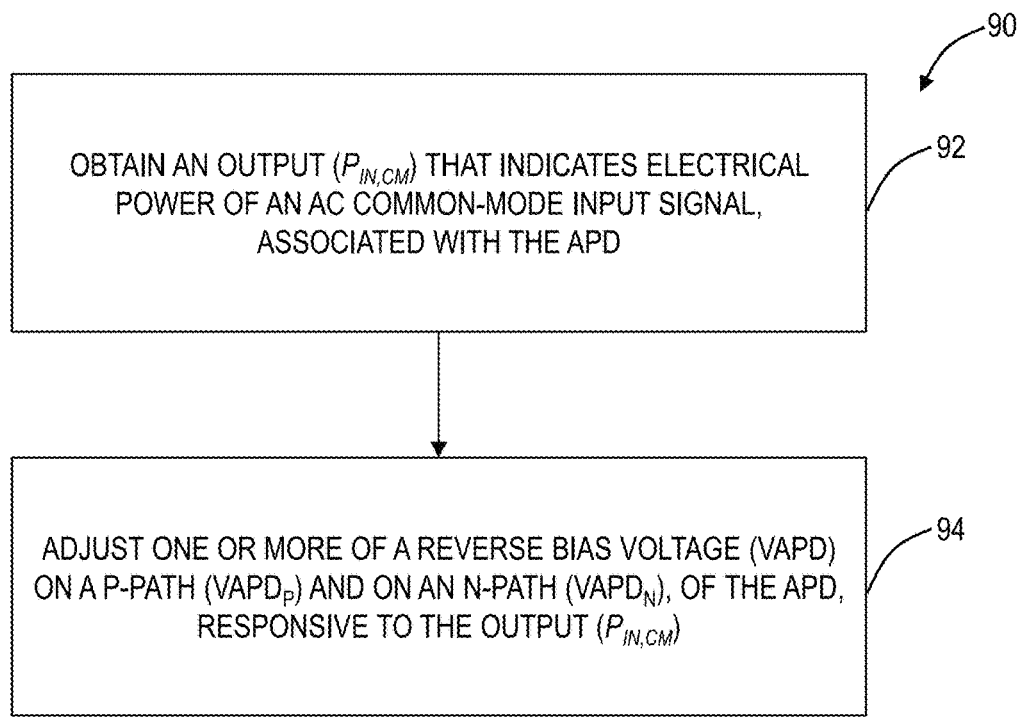
FIG. 6B is a flowchart of a process implemented to balance a pair of Avalanche Photodiodes (APD) photodetectors in a coherent receiver, specifically to optimize CMRR.

FIG. 6B is a flowchart of a process 90 implemented to balance a pair of Avalanche Photodiodes (APD) photodetectors in a coherent receiver, specifically to optimize CMRR. In an embodiment, the process 90 is implemented by the control processor 36, as a method, and as instructions stored on a non-transitory computer-readable medium.

The process 90 includes obtaining an output ($P_{IN,CM}$) that indicates electrical power of an AC common-mode input signal, associated with the APD (step 92), and adjusting one or more of a reverse bias voltage (VAPD) on a P-path ($VAPD_P$) and on an N-path ($VAPD_N$), of the APD, responsive to the output ($P_{IN,CM}$) (step 94). A common-mode optical noise rejection on a signal port is set based on a lowest value possible for the output ($P_{IN,CM}$). The coherent receiver can operate in a colorless network configuration where the common-mode optical noise rejection on the signal port dominates over the common-mode optical noise rejection on a Local Oscillator (LO) port.

The process 90 can further include adjusting a Transimpedance Amplifier (TIA) common-mode AC response, $Adj_{CM\_AC\_Response}$, based upon an output ($P_{OUT,CM}$) that indicates electrical power of an AC common-mode output signal. The common-mode AC response, $Adj_{CM\_AC\_Response}$, can be used to dynamically adjust a P-path and an N-path transfer function difference, based on a lowest value possible for the output ($P_{OUT,CM}$). The process 90 can further include adjusting one or more of $VAPD_P$ and $VAPD_N$ responsive to received signal Signal-to-Noise Ratio (SNR). The one or more of $VAPD_P$ and $VAPD_N$ can be set based on a highest value possible for the SNR.

Values of $VAPD_P$ and $VAPD_N$ can be used to adjust multiplication factors ($M_P$) and ($M_N$), respectively. The output ($P_{IN,CM}$) and the output ($P_{OUT,CM}$) can be from the TIA.

Figure 6C:
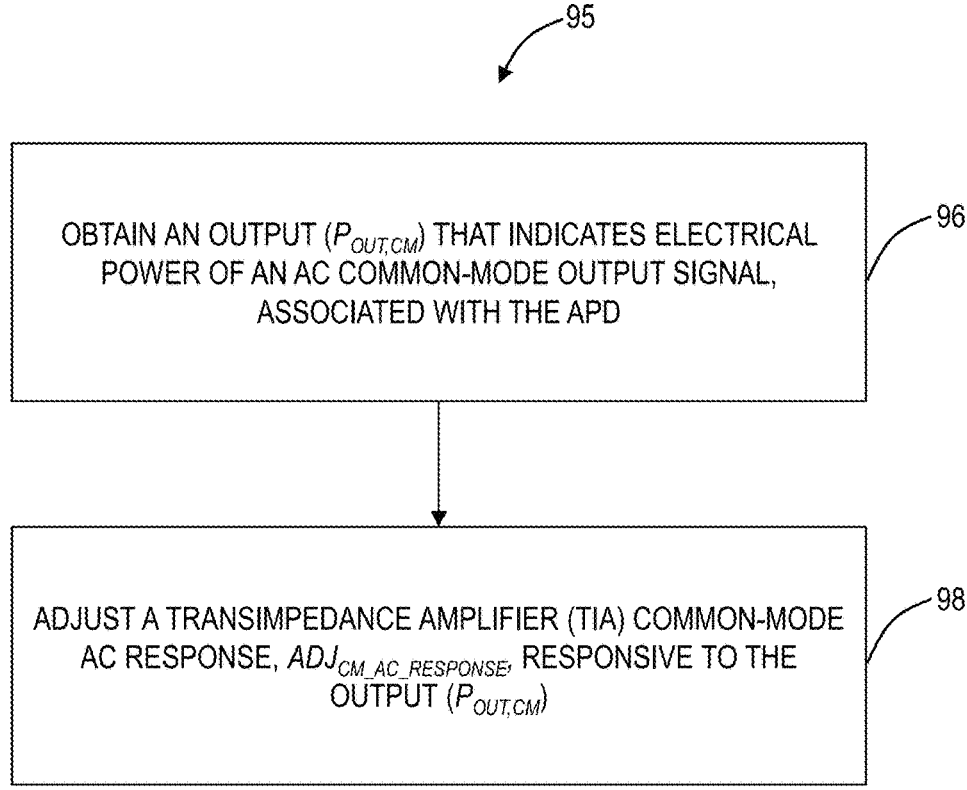
FIG. 6C is a flowchart of a process implemented to balance a pair of Avalanche Photodiodes (APD) photodetectors in a coherent receiver, specifically to optimize receiver differential transfer function.

FIG. 6C is a flowchart of a process 95 implemented to balance a pair of Avalanche Photodiodes (APD) photodetectors in a coherent receiver, specifically to optimize receiver differential transfer function. In an embodiment, the process 95 is implemented by the control processor 36, as a method, and as instructions stored on a non-transitory computer-readable medium.

The process 95 includes obtaining an output ($P_{OUT,CM}$) that indicates electrical power of an AC common-mode output signal, associated with the APD (step 96), and adjusting a Transimpedance Amplifier (TIA) common-mode AC response, $Adj_{CM\_AC\_Response}$, responsive to the output ($P_{OUT,CM}$) (step 98). The common-mode AC response, $Adj_{CM\_AC\_Response}$, can be used to dynamically adjust a P-path and an N-path transfer function difference, based on a lowest value possible for the output ($P_{OUT,CM}$).

The process 95 can further include adjusting one or more of a reverse bias voltage (VAPD) on a P-path ($VAPD_P$) and on an N-path ($VAPD_N$) responsive to an output ($P_{IN,CM}$) that indicates electrical power of an AC common-mode input signal. A common-mode optical noise rejection on a signal port can be set based on a lowest value possible for the output ($P_{IN,CM}$).

The process 95 can further include adjusting adjust one or more of $VAPD_P$ and $VAPD_N$ responsive to received signal Signal-to-Noise Ratio (SNR). Values of $VAPD_P$ and $VAPD_N$ can be used to adjust multiplication factors ($M_P$) and ($M_N$), respectively. The output ($P_{IN,CM}$) and the output ($P_{OUT,CM}$) can be from the TIA.

§ 2.0 LATERAL HETEROJUNCTION AVALANCHE PHOTODIODE WITH SEPARATE ABSORPTION AND MULTIPLICATION REGION

Again, conventional germanium-on-silicon avalanche photodetectors APDs lack independent control over gain and bandwidth because of dependency on the reverse bias voltage. In addition, these APDs suffer from high excess noise due to the multiplication of carriers happening in germanium. This disclosure addresses both issues by implementing a novel lateral heterojunction Ge-on-Si APD design with four contacts, which enables the tuning of the gain of the APD by controlling the electric field in the germanium and silicon through two gain control contacts. This added gain tuning control can/will also be used to tailor the electric field profile such that multiplication happens mostly in silicon to achieve lower excess noise and bandwidth invariability. This excess noise is the factor by which the APD noise power increases compared with that of an ideal photodetector. Thus, keeping the additional noise low while increasing the multiplication gain of the APD and maintaining the bandwidth of the APD achieves the desired result.

§ 2.1 Theoretical Background and Problem Description

APDs operate through a process called impact ionization (also called avalanche multiplication). When the electric field induced by the external reverse bias voltage in an APD is increased above a certain value, carriers generated through photon absorption, gain enough energy to excite other electron-hole pairs. Through the impact ionization process and internal current gain, APDs can offer higher sensitivity compared to P-I-N photodetectors (PD) in a communications system. In a Silicon Photonics (SiP) platform, PDs are formed by epitaxially growing a thin germanium layer on a silicon waveguide. Because of its bandgap energy, Ge is an excellent absorption material at telecom wavelengths (1260 nm-1625 nm); however, Ge is not a suitable medium for multiplication, as its K-factor, which is used to determine the excess noise (amplification noise) of an APD, is very high. On the other hand, Si is an excellent multiplication medium, with one of the lowest K-factors among semiconductor materials.

Figure 7:
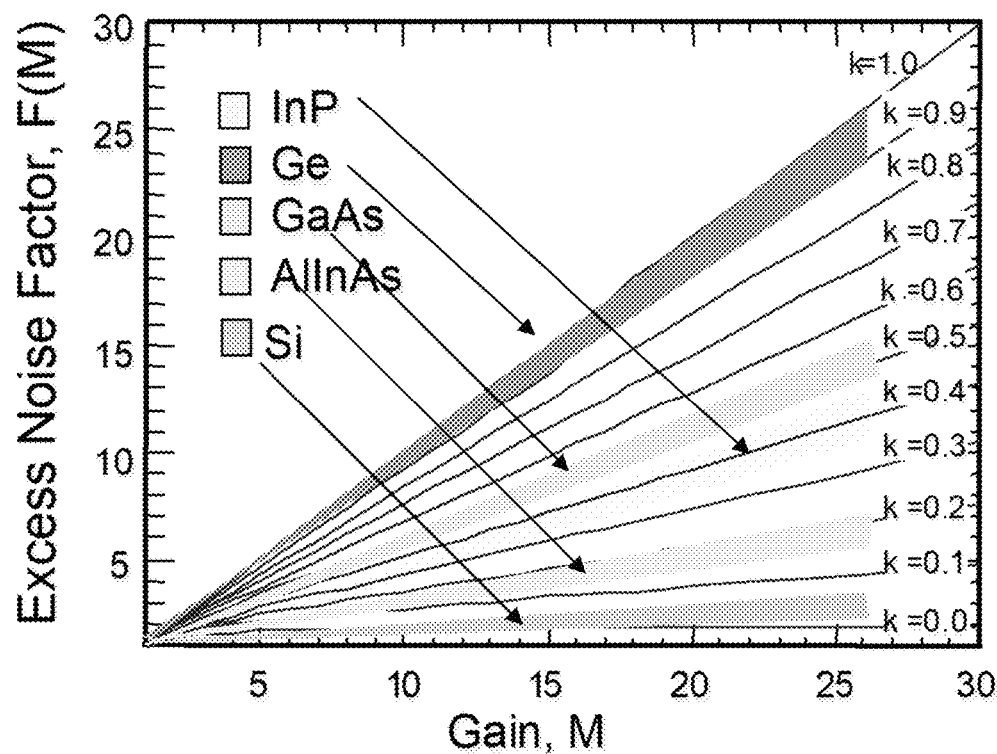
FIG. 7 is a graph illustrating excess noise factor versus gain for different K-factors and the McIntyre estimate of excess noise for different materials.

FIG. 7 is a graph illustrating excess noise factor versus gain for different K-factors and the McIntyre estimate of excess noise for different materials. FIG. 7 is from Xiaogang Bai, Ping Yuan, Paul McDonald, Joseph Boisvert, James Chang, Rengarajan Sudharsanan, Michael Krainak, Guangning Yang, Xiaoli Sun, Wei Lu, Zhiwen Lu, Qiugui Zhou, Wenlu Sun, Joe Campbell, "Development of low excess noise SWIR APDs," Proc. SPIE 8353, Infrared Technology and Applications XXXVIII, 83532H (31 May 2012); available online at doi.org/10.1117/12.919397, the contents of which are incorporated by reference. Taking advantage of this, the presented disclosure aims to control the multiplication amount and region to obtain gain control and low noise operation.

Figure 8A:
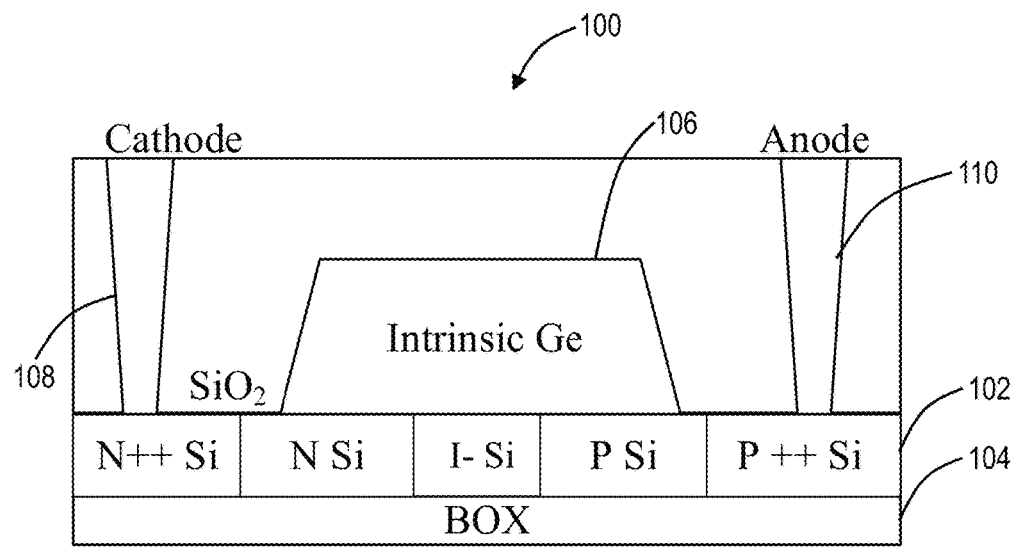
FIGS. 8A and 8B are a cross-sectional diagram (FIG. 8A) and a top-view diagram (FIG. 8B) of a conventional waveguide coupled lateral-junction Ge-on-Si APD 100 design.
Figure 8B:
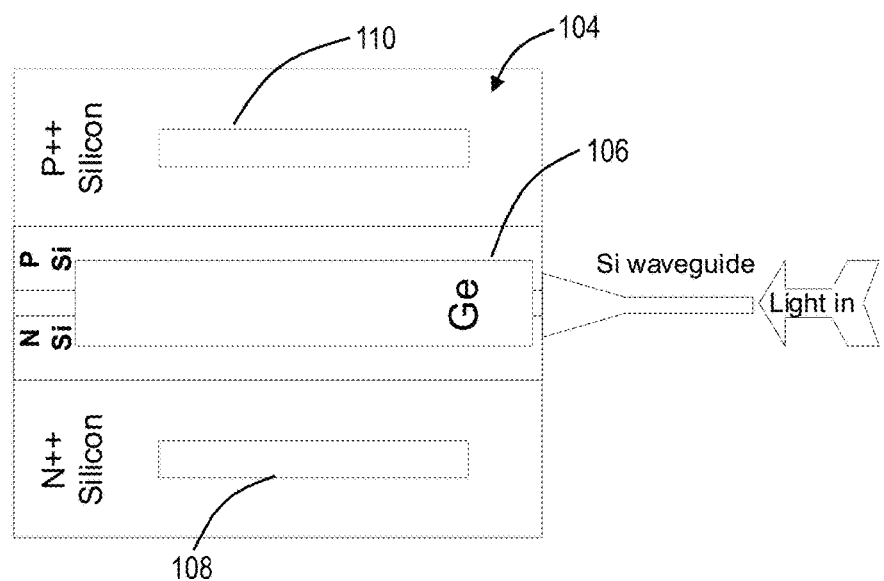

FIGS. 8A and 8B are a cross-sectional diagram (FIG. 8A) and a top-view diagram (FIG. 8B) of a conventional waveguide coupled lateral-junction Ge-on-Si APD 100 design. In these APDs 100, the PIN junction is formed laterally on Si 102, such as on a Buried Oxide (BOX) layer 104, which is a substrate. The light propagating in the Si 102 waveguide is evanescently coupled (or butt-coupled) into the germanium 106, where it is absorbed. The generated carriers (electron-hole pairs) from the photon absorption are then collected at a cathode 108 and an anode 110 on the Si 102 by applying a reverse bias voltage. As the reverse bias voltage increases, the electric field intensity increases. If the electric field in the depletion region is high enough, the generated carriers start the avalanche multiplication process. Because the anode 110 and cathode 109 contacts of the APD 100 are on silicon and farther away from the Ge 106, these types of APDs 100 require very high reverse bias voltage to generate enough electric field intensity in the Ge 106 for the photogenerated carriers to reach saturation velocity. Furthermore, the electric field in the Ge 106 layer is non-uniform, and some of the photogenerated carriers do not observe a high enough electric field to reach saturation velocity resulting in longer transit time and lower bandwidth.

The gain of the APD 100 is dependent on the reverse bias voltage applied between the cathode 108 and anode 110. In addition, the avalanche multiplication happens in both doped Si 102 and Ge 106, which results in higher excess noise. These APDs 100 suffer from three main shortcomings: a) high reverse bias voltage required for multiplication, b) non-uniform E-field in Ge and lack of independent control of the gain, and c) high excess noise stemming from the absence of independent control of the electric field in the Ge 106 and the Si 102 layers.

§ 2.2 New Lateral Junction APD Design

Figure 9A:
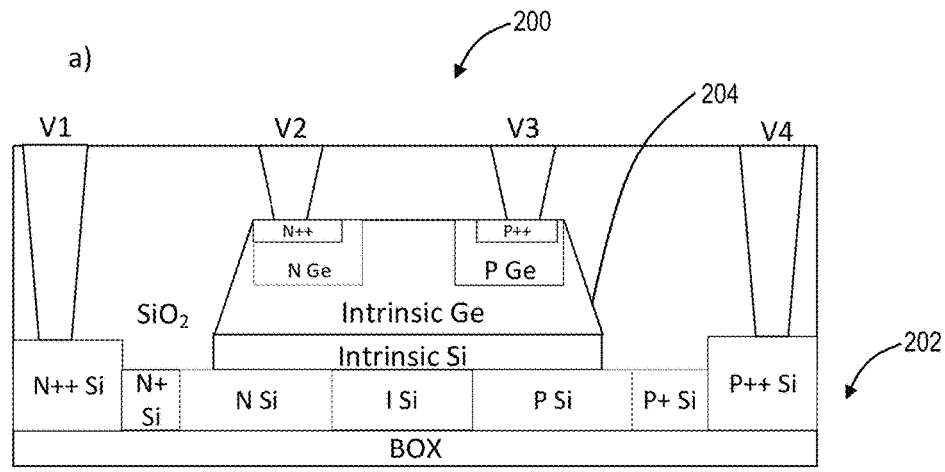
FIGS. 9A, 9B, 9C, and 9D are a cross-sectional diagram (FIG. 9A), a three-dimensional diagram (FIG. 9B), a top-view diagram (FIG. 9C), and a schematic (FIG. 9D) of voltage ranges for device operation of a lateral heterojunction APD.
Figure 9B:
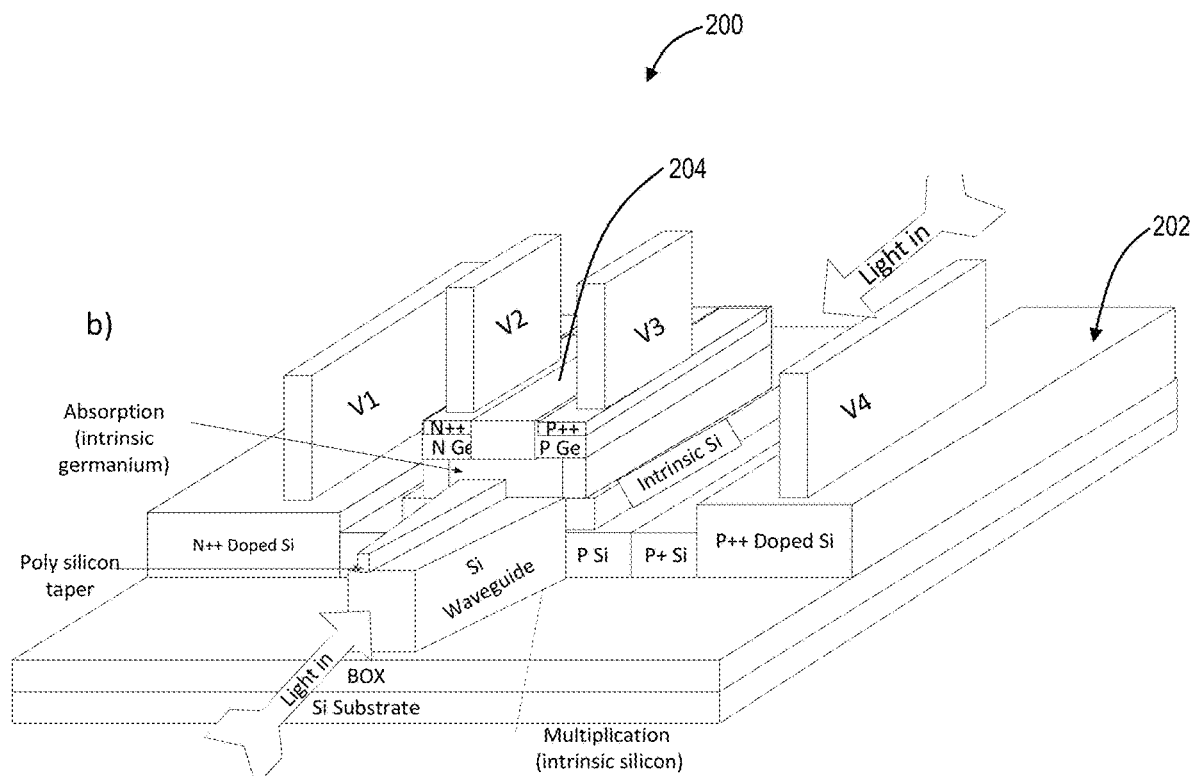
Figure 9C:
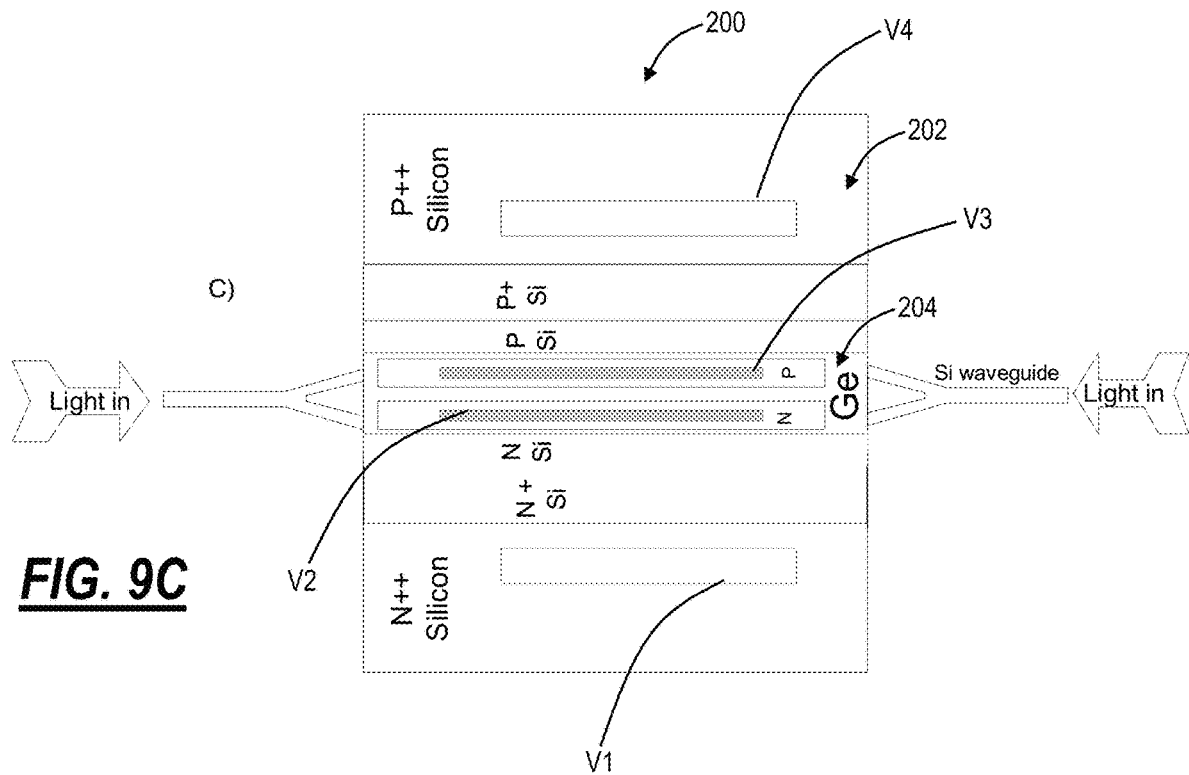
Figure 9D:
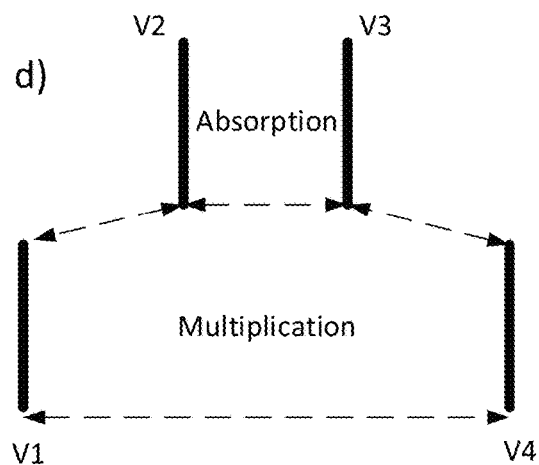

FIGS. 9A, 9B, 9C, and 9D are a cross-sectional diagram (FIG. 9A), a three-dimensional diagram (FIG. 9B), a top-view diagram (FIG. 9C), and a schematic (FIG. 9D) of voltage ranges for device operation of a lateral junction APD 200. The present disclosure includes a new lateral junction APD 200 design which implements two separate gain tuning contacts V2, V3, in addition to the cathode V1 and anode V4, that enable further control of electric field in the Si 202 and the Ge 204 layers, that are on top of a substrate, e.g., BOX. This would allow dynamic control of the gain of the APD 200 as well as improved excess noise performance of the APD 200 while minimizing the bandwidth variations by enforcing impact ionization to happen dominantly in the Si 202. FIGS. 9A, 9B, and 9C demonstrate APD 200 cross-section, 3D-view, top-view, and voltage ranges for each contact V1-V4 of the APD 200. In this disclosure, two separate PIN junctions are formed in the Si 202 and the Ge 204 layers. With the anode V4 and cathode V1 contacts on the Si 202 and the two gain control contacts V2, V3 on the Ge 204 region. Using the two contacts V2, V3 on the Ge enables a more uniform and symmetric E-Field in the Ge 204. Of note, the cathode and anode can either both be on the Si layer 202, or appropriately placed on both the silicon and germanium layers 202, 204 to facilitate the APD functionality as described herein. As such, the cathode and anode can be said to be on any of the layers 202, 204.

The APD 200 key design features are listed as follows:
1) Highly N doped and P doped silicon (N++ and P++) regions are used to form ohmic contact on Si (V1 and V4). V1 and V4 are used to bias the APD 200; The potential between V1 and V4 may be varied to control the gain. This way either V1 or V4 could be varied to control gain.
2) Intermediate P doped and N doped silicon (P+ and N+) are used to improve the series resistance of the APD 200 and decrease optical losses due to ion implantation.
3) P doped, intrinsic, and N doped silicon underneath the intrinsic silicon layer and the Ge 204 are used to create the PIN junction. The widths of these implantations would affect the electric field distribution in Ge 204, the breakdown voltage, and the bandwidth of the APD 200.
3) A thin intrinsic silicon region on top of the doped Si 202 is used as a low noise multiplication medium where the E-field intensity will be high. This layer's thickness would affect the bandwidth, and noise factor of the APD 200.
4) An optional polysilicon taper grown on top of the silicon waveguide is used to potentially improve light coupling from the silicon waveguide to the germanium layer.
5) A Ge layer is epitaxially grown on the intrinsic silicon layer to form the absorption medium of the APD 200. The thickness of the Ge layer affects the absorption (initial responsivity), bandwidth, and noise factor of the APD 200.
6) Shallow high dosage N doped Ge is used to form an offset-contact from V1 (V2) to the Ge. Deep low dosage N doped Ge is used to prevent excessive E-field intensity in the Ge.
7) Shallow highly doped P Ge is used to form the second contact on Ge (V3). Deep low dosage P Ge is used to create a PIN junction in Ge. This voltage in conjunction with the offset-contact on N doped Ge is used to reverse bias the Ge, and to tune the electric field strength inside the Ge so that the carriers reach saturation velocity. The two contacts V2, V3 on Ge improve the uniformity of the electric field inside the Ge.
8) The gain of the APD 200 is determined by the electric field across the intrinsic-silicon layer, and thus by the voltage differences between the silicon bias voltages (V1 and V4) and the germanium bias voltages (V2 and V3).
9) The junction and contacts are structured such that it promotes the APD to be illuminated from both ends, allowing it to be used with the disclosure of commonly-assigned U.S. Pat. No. 10,830,638, the contents of which are incorporated by reference in their entirety.

Figure 10:
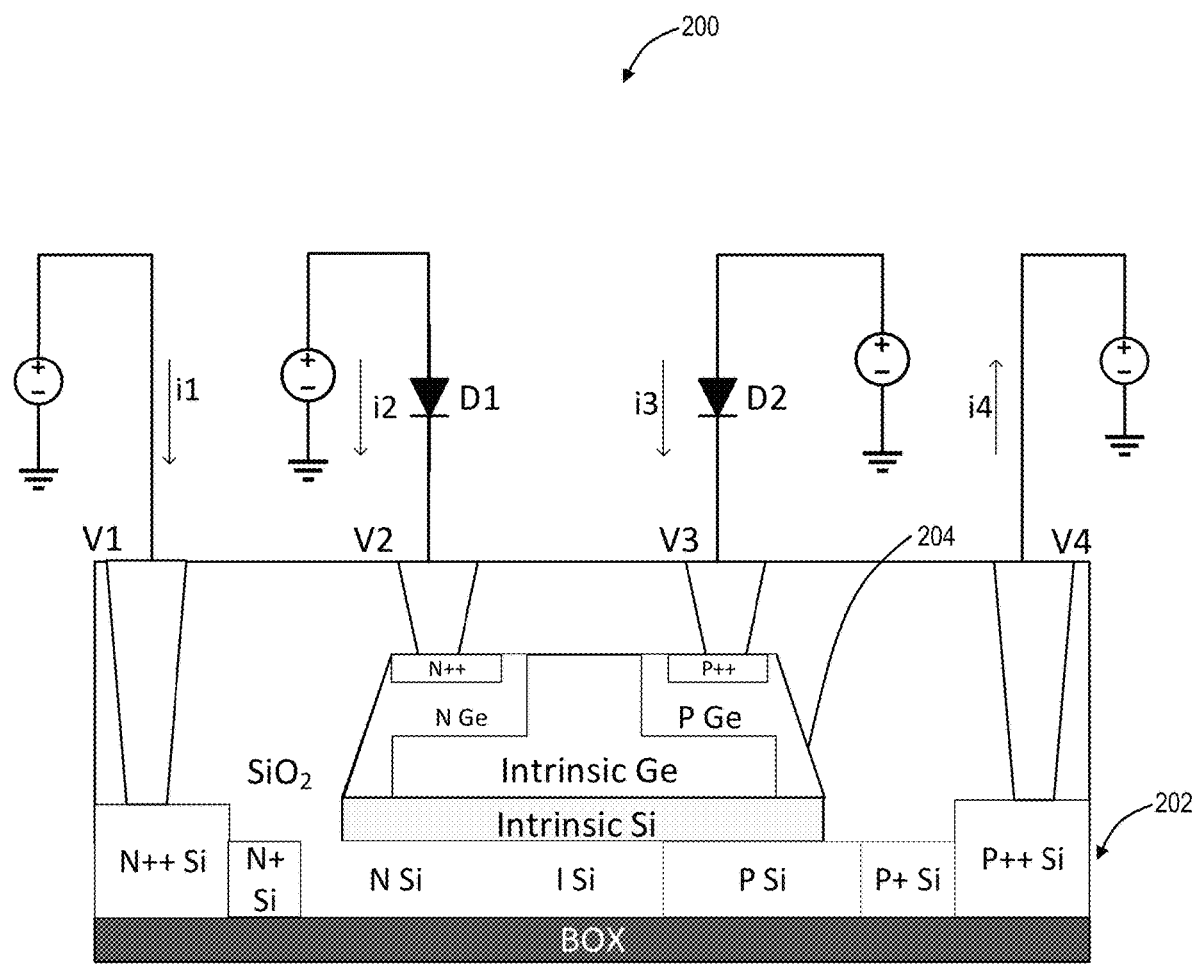
FIG. 10 is a diagram of the current flow and simplified biasing of the APD.
Figure 11A:
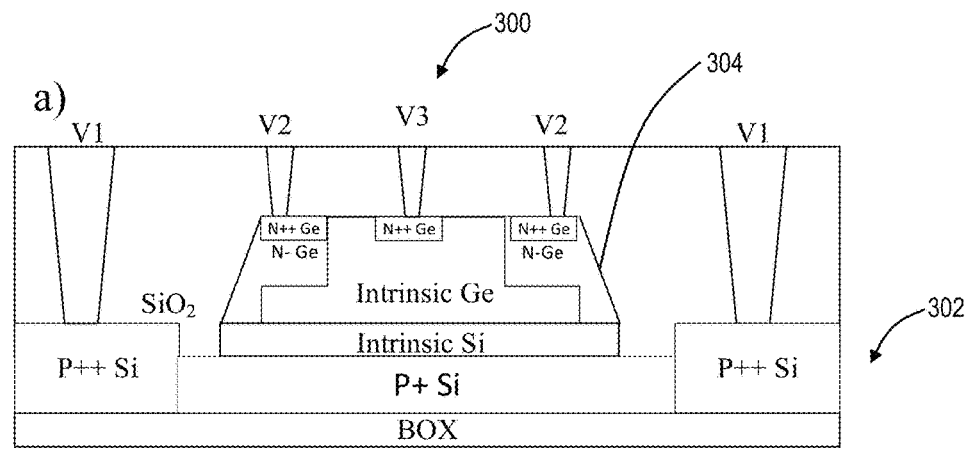
FIGS. 11A, 11B, 11C, and 11D are a cross-sectional diagram (FIG. 11A), a three-dimensional diagram (FIG. 11B), a top-view diagram (FIG. 11C), and a schematic (FIG. 11D) of voltage ranges for device operation of a vertical heterojunction APD.
Figure 11B:
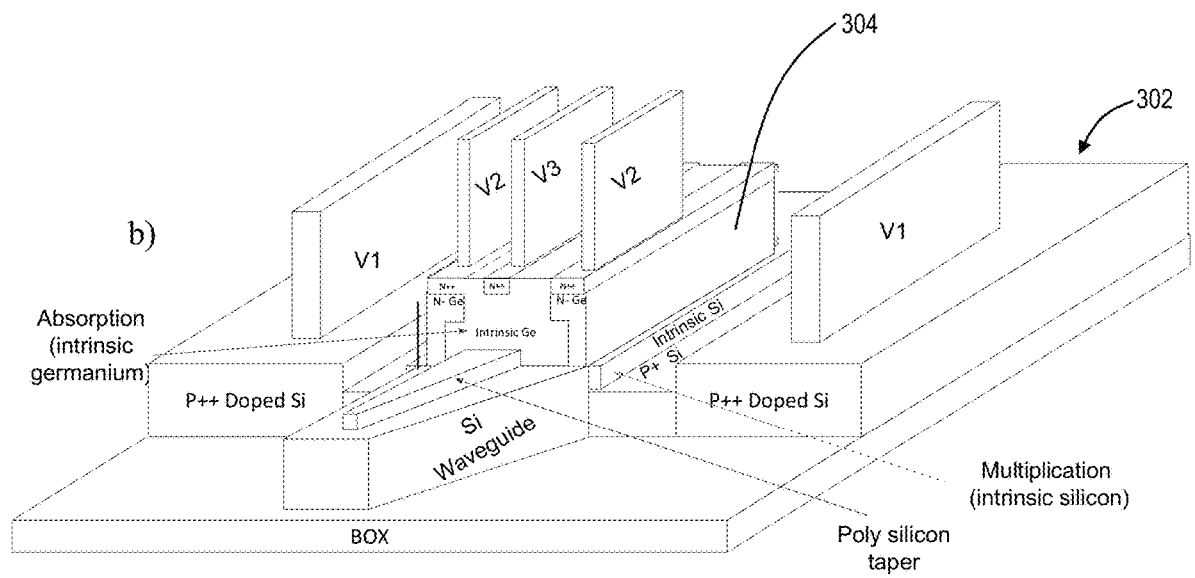
Figure 11C:
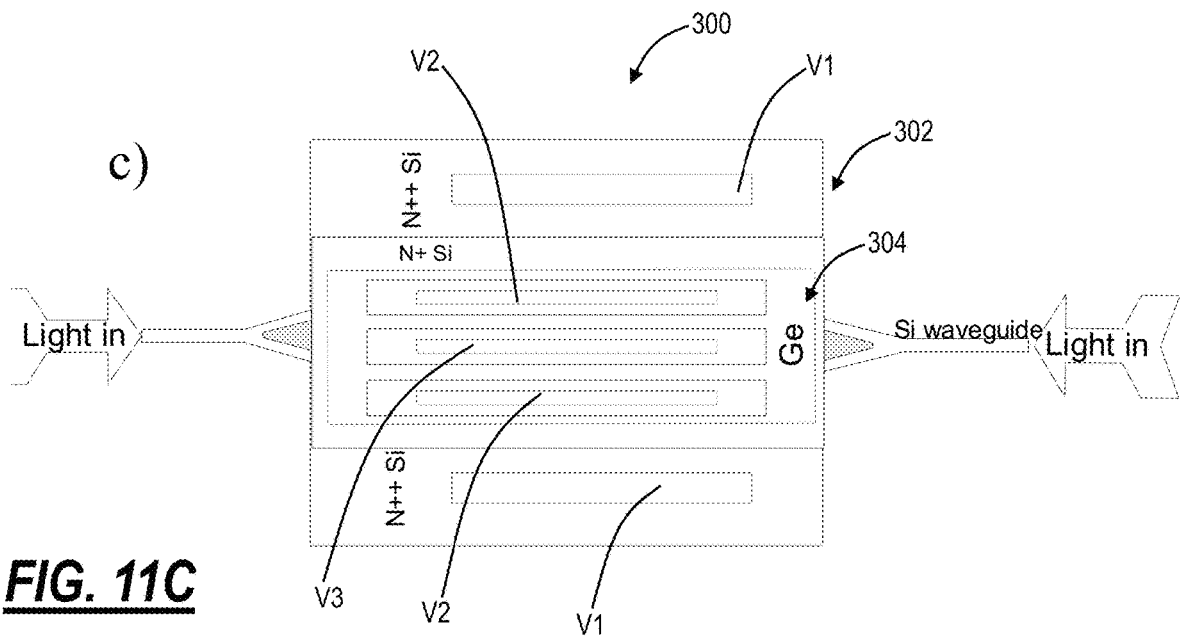
Figure 11D:
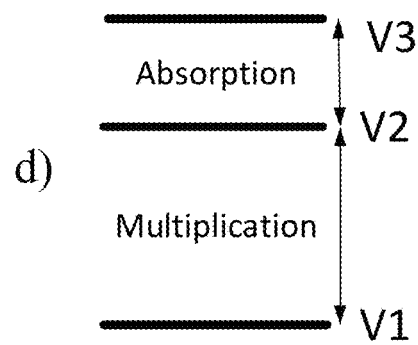

FIG. 10 is a diagram of the current flow and simplified biasing of the APD 200. Light from the waveguide is evanescently coupled into the Ge 204. V1, V2 and V3 are set such that the APD 200 is reverse biased and the electric field intensity is strong enough that the photogenerated carriers reach saturation velocity. Next, V4 is tuned relative to V1, V2, and V3 to control the gain of the APD 200 by controlling the electric field in i-Si regions. V2 and V3 may be adjusted to enhance the E-field in the Ge 204.

External diodes D1 and D2 may be used at terminals V2 and V3 to enforce unidirectional current flow—preventing current from flowing out of V2 and V3, i.e., $i2>0$ and $i3>0$. V1, V2, V3 are biased such that $i1\gg i2$, $i1\gg i3$. $i4$ will have DC and RF components.

The cathode V1 and anode V4 are on the silicon, and the two gain control contacts V2, V3 are on the Ge. In addition, a PIN junction is formed on the Ge to improve e-field uniformity in the Ge and enable the two gain control contacts. This approach addresses shortcomings by a) placing the gain control contacts (V2 and V3) on Ge, which then allows the APD to be illuminated from both ends, and b) creating a PIN junction in the Ge, to improve the E-field intensity inside the Ge, and c) placing the intrinsic Si directly below the Ge and on top of the PIN region of the Si, allowing all of the photogenerated carriers to undergo multiplication in i-Si.

This approach would reduce the minimum received optical power required for SiP coherent receivers, and or redirecting a higher portion of LO power to the transmitter, crucial for loss limited links or allowing for other transmitter-side tradeoffs such as Vpi and Bandwidth.

Further implementing the gain control in balanced receivers (PD pair) in § 1.0-§ 1.4 can improve the noise performance of the APDs and minimize bandwidth variability and allow us to compensate any variations in the optical received power by adjusting the gain of each PD independently, achieving optimum balanced photodetection, i.e., optimized CMRR and SNR performance.

§ 3.0 LOW EXCESS NOISE VERTICAL HETEROJUNCTION AVALANCHE PHOTODIODE WITH GAIN CONTROL

Also, the present disclosure includes a novel vertical heterojunction Ge-on-Si avalanche photodetector (APD) design which enables the tuning of the gain of the APD by controlling the electric field in the germanium and silicon through a third contact. It addresses two critical issues observed with conventional vertical junction Ge-on-Si APDs. First, the lack of independent control over gain and bandwidth because of dependency on a single reverse bias voltage. Secondly, conventional APDs suffer from high excess noise due to the multiplication of carriers happening in germanium. The heterojunction's added gain tuning control voltage can be used to increase the electric field in just the silicon so that the multiplication happens mostly there instead of in the germanium to achieve lower excess noise. This excess noise is the factor by which the APD noise power increases compared with that of an ideal photodetector, and keeping the additional noise low while increasing the multiplication gain of the APD is the desired result.

§ 3.1 New Vertical Heterojunction APD Design

FIGS. 11A, 11B, 11C, and 11D are a cross-sectional diagram (FIG. 11A), a three-dimensional diagram (FIG. 11B), a top-view diagram (FIG. 11C), and a schematic (FIG. 11D) of voltage ranges for device operation of a vertical heterojunction APD 300. The present disclosure includes a new vertical junction APD 300 design that implements gain-tuning contacts V1, V2, V3 that enable further control of electric field separately in the Si 302 and Ge 304 layers. This would allow dynamic control of the gain of the device as well as improved excess noise performance of the APD 302 by enforcing impact ionization to happen dominantly in Si 302. Of note, FIGS. 11A and 11B include P doping in the Si 302 layer and N doping in the Ge layer 304. In another embodiment, these can be switched, namely N doping in the Si layer 302 and P doping in the Ge layer 302. That is, these embodiments contemplate a same type of doping in each of the layers 302, 304.

The APD's 300 key design features are described below:
1) A highly P doped silicon (P++) regions are used to form the ohmic contact to the Si (V1).
2) Intermediate P doped silicon (P+) is used to improve the series resistance of the APD and decrease optical losses due to ion implantation.
3) A thin intrinsic silicon region on top of the P+ Si is used as a low noise multiplication medium.
4) An optional polysilicon taper grown on top of the silicon waveguide is used to potentially improve light coupling from the silicon waveguide to the germanium layer and improve responsivity by lowering the optical losses in P+ silicon region.
5) A Ge layer is epitaxially grown on the intrinsic silicon layer to form the absorption medium of the APD 300.
6) Highly doped shallow N++Ge, used to form the ohmic contacts to the Ge (V3 and V2).
7) Deep low dosage N− Ge, used for reverse biasing the Ge (V3-V2) and control the gain by varying the potential between V3 and V1 (V3−V1). This way either V3 or V1 can be varied.
8) The junction and contacts are structured such that it promotes the APD to be illuminated from both ends, allowing it to be used with U.S. Pat. No. 10,830,638.

Figure 12:
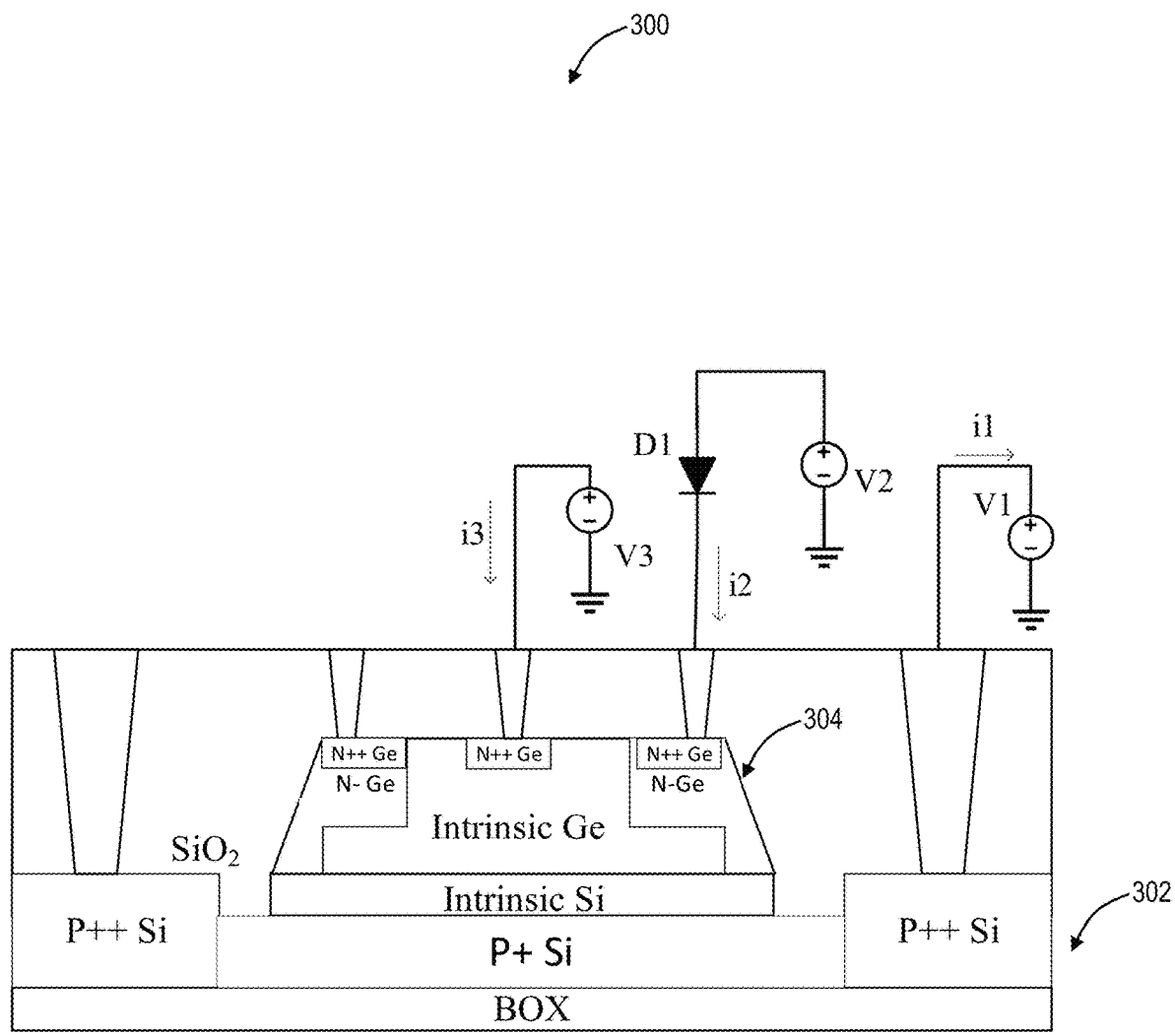
FIG. 12 is a diagram of the current flow and simplified biasing of the APD.

FIG. 12 is a diagram of the current flow and simplified biasing of the APD 300. Light from the waveguide is coupled evanescently into the Ge. V3 and V2 are biased such that the Ge is properly biased to ensure that the photogenerated carriers reach saturation velocity and thus that the transit time across the device is minimized. Next, V1 is tuned relative to V2 to vary the electric field in Ge and i-Si and to control the gain. The objective is to obtain a stronger electric field intensity in the silicon (V1−V2) such that the carriers undergo impact ionization in silicon, and enough electric field intensity in the Ge, for the carriers to reach saturation velocity and minimize the transit time in Ge. FIG. 12 demonstrates the connectivity and current at each terminal. A diode (D1) may be used to ensure the direction of current flow at V2 such that i2>0. Also, note that i3>>i2. The i1 current will have both DC and RF components.

The ion implantation dosages and energies as well as the widths, heights, and lengths of the Si (doped and intrinsic), Ge, and doping regions can be optimized for specific target performance. The polarity of the APD doping can be changed as well.

§ 4.0 PROCESS TO FORM AN APD

Figure 13:
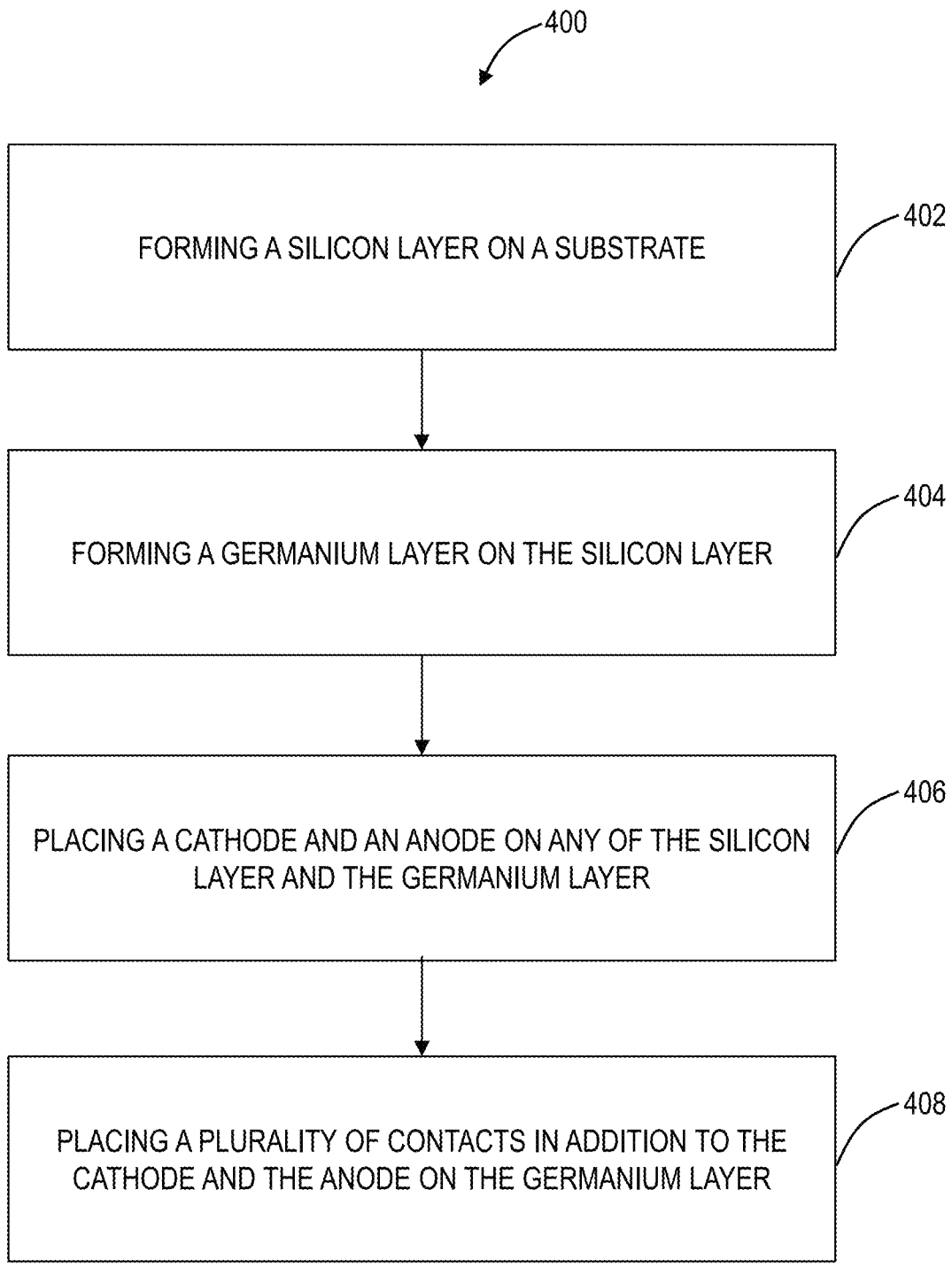
FIG. 13 is a flowchart of a process for forming an APD.

FIG. 13 is a flowchart of a process 400 for forming an APD. The process 800 includes forming a silicon layer on a substrate (step 402); forming a germanium layer on the silicon layer (step 404); placing a cathode and an anode on any of the silicon layer and the germanium layer (step 406); and placing a plurality of contacts in addition to the cathode and the anode on the germanium layer (step 408).

The silicon layer can include a highly doped region at each end, an intrinsic doped region in a middle, and an intermediately doped region between the highly doped region at each end and the intrinsic doped region, and wherein the cathode and the anode are each at a respective a highly doped region at each end.

The germanium layer can include a plurality of highly doped regions with each including one of the plurality of contacts. The germanium layer can include a plurality of highly doped regions with each including one of the plurality of contacts, a plurality of intermediately doped regions each under a respective one of the plurality of highly doped regions, and an intrinsic doped region in a middle between each of the plurality of highly doped regions and the plurality of intermediately doped regions.

The plurality of contacts are configured to reverse bias the germanium layer to tune an electric field strength therein so that carriers reach saturation velocity.

§ 5.0 CONCLUSION

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs) and the like; along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to", "logic configured to", etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, one or more processors, circuit, etc. to perform functions as described and claimed herein. Examples of such non-transitory computer-readable medium may include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by one or more processors (e.g., any type of programmable circuitry or logic) that, in response to such execution, cause the one or more processors to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, it is noted that the various elements described herein can be used in any and all combinations with each other.

What is claimed is:

1. An avalanche photodiode comprising:
   a silicon layer on a substrate including a highly doped region at each end;
   a germanium layer on the silicon layer including a plurality of highly doped regions;
   a cathode and an anode each on one of the highly doped region at each end of the silicon layer; and
   a plurality of contacts each on a corresponding region of the plurality of highly doped regions of the germanium layer, in addition to the cathode and the anode.

2. The avalanche photodiode of claim 1, wherein the silicon layer includes the highly doped region at each end, an intrinsic doped region in a middle, and an intermediately doped region between the highly doped region at each end and the intrinsic doped region.

3. The avalanche photodiode of claim 1, wherein the highly doped region at one end is N doped and is P doped at another end.

4. The avalanche photodiode of claim 1, wherein the highly doped region includes a same type of doping at both ends.

5. The avalanche photodiode of claim 1, wherein the plurality of highly doped regions include an N doped region with a first contact of the plurality of contacts and a P doped region with a second contact of the plurality of contacts.

6. The avalanche photodiode of claim 1, wherein the plurality of highly doped regions include three doped regions of a same type of doping each with a contact of the plurality of contacts.

7. The avalanche photodiode of claim 1, wherein the germanium layer includes
   a plurality of intermediately doped regions each under a respective one of the plurality of highly doped regions, and
   an intrinsic doped region in a middle between each of the plurality of highly doped regions and the plurality of intermediately doped regions.

8. The avalanche photodiode of claim 1, wherein the plurality of contacts are configured to reverse bias the germanium layer to tune an electric field strength therein so that carriers reach saturation velocity.

9. The avalanche photodiode of claim 1, wherein a gain of the avalanche photodiode is determined by voltage differences between voltages across the silicon layer and voltages across the germanium layer.

10. The avalanche photodiode of claim 1, wherein the silicon layer includes an intrinsic doped region in a middle that is configured to receive light from two directions.

11. The avalanche photodiode of claim 1, wherein the silicon layer includes an intrinsic doped region in a middle with a taper for light coupling.

12. The avalanche photodiode of claim 1, wherein the plurality of contacts include at least three contacts and at least three applied voltages.

13. The avalanche photodiode of claim 12, wherein voltage differences between any of the at least three applied voltages are used to i) bias any of the germanium layer and the silicon layer, and ii) to control gain.

14. An avalanche photodiode formed by a process comprising steps of:
   with a silicon layer on a substrate, forming a germanium layer on the silicon layer, wherein the germanium layer includes a plurality of high doped regions and the silicon layer includes a highly doped region at each end;
   placing a cathode and an anode each on one of the highly doped region at each end of the silicon layer; and
   placing a plurality of contacts each on a corresponding region of the plurality of highly dope regions of the germanium layer, in addition to the cathode and the anode.

15. The avalanche photodiode of claim 14, wherein the silicon layer includes the highly doped region at each end, an intrinsic doped region in a middle, and an intermediately doped region between the highly doped region at each end and the intrinsic doped region.

16. The avalanche photodiode of claim 14, wherein the germanium layer includes
- a plurality of intermediately doped regions each under a respective one of the plurality of highly doped regions, and
- an intrinsic doped region in a middle between each of the plurality of highly doped regions and the plurality of intermediately doped regions.

17. The avalanche photodiode of claim 14, wherein the plurality of contacts is configured to reverse bias the germanium layer to tune an electric field strength therein so that carriers reach saturation velocity.

18. The avalanche photodiode of claim 14, wherein a gain of the avalanche photodiode is determined by voltage differences between voltages across the silicon layer and voltages across the germanium layer.

* * * * *